US012676633B2

(12) United States Patent
Huang et al.

(10) Patent No.: US 12,676,633 B2
(45) Date of Patent: Jul. 7, 2026

(54) SIGNAL DETECTION METHOD, SIGNAL PROCESSING METHOD AND SIGNAL PROCESSING MODEL

(71) Applicant: NEURACLE TECHNOLOGY (SHANGHAI) CO., LTD., Shanghai (CN)

(72) Inventors: Xiaoshan Huang, Shanghai (CN); Honglai Xu, Shanghai (CN); Xirui Zhang, Shanghai (CN); Changhui Gong, Shanghai (CN); Xing Liang, Shanghai (CN)

(73) Assignee: NEURACLE TECHNOLOGY (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 19/122,064

(22) PCT Filed: May 12, 2023

(86) PCT No.: PCT/CN2023/093732
§ 371 (c)(1),
(2) Date: Apr. 17, 2025

(87) PCT Pub. No.: WO2024/093188
PCT Pub. Date: May 10, 2024

(65) Prior Publication Data
US 2026/0113056 A1 Apr. 23, 2026

(30) Foreign Application Priority Data
Oct. 31, 2022 (CN) .......................... 202211342078.2

(51) Int. Cl.
*H03M 7/00* (2006.01)
*H03M 7/38* (2006.01)
*H03M 7/40* (2006.01)

(52) U.S. Cl.
CPC ....... *H03M 7/3046* (2013.01); *H03M 7/4031* (2013.01)

(58) Field of Classification Search
CPC ............. H03M 7/6064; H03M 7/3059; H03M 7/6011; H03M 7/30; H03M 7/6094;
(Continued)

(56) References Cited

U.S. PATENT DOCUMENTS 5,485,213 A * 1/1996 Murashita ............ H04N 19/503
375/E7.263
6,819,271 B2 * 11/2004 Geiger ................. H04N 19/436
341/51
(Continued)

FOREIGN PATENT DOCUMENTS

CN 106714036 A 5/2017
CN 109700450 A 5/2019
(Continued)

OTHER PUBLICATIONS

International Search Report cited in PCT/CN2023/093732, mailed Jun. 23, 2023, 5 pages.
(Continued)

*Primary Examiner* — Linh V Nguyen
(74) *Attorney, Agent, or Firm* — Cooper Legal Group, LLC

(57) ABSTRACT

The present disclosure relates to the technical field of signal detection, and specifically, provides a signal detection method, a signal processing method, and a signal processing model. The signal detection method includes: preprocessing a signal, namely processing a signal point in a signal segment, to obtain a processed value of the signal point; and detecting whether the processed value exceeds a specified overflow threshold range, to select a different reprocessing method based on a detection result of the processed value.

(Continued)

Especially in a detection process before signal reprocessing, the signal can be processed in a targeted manner based on the detection result of the processed value, thereby effectively improving a processing effect of the signal.

11 Claims, 12 Drawing Sheets

(58) Field of Classification Search
CPC ...... H03M 7/607; H03M 7/40; H03M 7/3066; H03M 7/6005; H03M 7/00; H03M 7/3077; H03M 7/3079; H03M 7/4081; H03M 7/6023; H03M 7/6041; H03M 7/3086; H03M 7/42; H03M 7/3088; H03M 7/4031; H03M 7/4056; H03M 7/6029; H03M 7/70; H03M 7/3068
USPC ............................... 341/51, 106, 107, 86, 87
See application file for complete search history.

(56) References Cited

U.S. PATENT DOCUMENTS

| | | | | |
|---|---|---|---|---|
| 7,009,533 | B1 * | 3/2006 | Wegener | H04N 1/413 |
| | | | | 341/87 |
| 7,835,435 | B2 * | 11/2010 | Soni | H04B 1/66 |
| | | | | 375/240 |
| 9,425,819 | B1 * | 8/2016 | Liaghati | H03M 7/3046 |
| 11,967,118 | B1 * | 4/2024 | Brown | G06T 3/40 |
| 2009/0313188 | A1 | 12/2009 | Baker | |
| 2010/0077265 | A1 * | 3/2010 | Wei | H03M 13/296 |
| | | | | 714/701 |
| 2011/0135013 | A1 * | 6/2011 | Wegener | H03M 7/40 |
| | | | | 375/241 |
| 2013/0187798 | A1 * | 7/2013 | Marpe | H03M 7/40 |
| | | | | 341/67 |
| 2013/0243105 | A1 | 9/2013 | Lei et al. | |
| 2013/0315288 | A1 * | 11/2013 | Weng | H03M 7/6094 |
| | | | | 375/227 |
| 2014/0210652 | A1 * | 7/2014 | Bartnik | H03M 7/40 |
| | | | | 341/67 |
| 2023/0361788 | A1 * | 11/2023 | Yang | H03M 13/2906 |

FOREIGN PATENT DOCUMENTS

| | | |
|---|---|---|
| CN | 111513706 A | 8/2020 |
| CN | 112347413 A | 2/2021 |

OTHER PUBLICATIONS

Written Opinion cited in PCT/CN2023/093732, mailed Jun. 23, 2023, 7 pages.
First CN Office Action cited in CN 202211342078.2, Dec. 7, 2022, 9 pages.
Notification of Grant cited in CN 202211342078.2, mailed Jan. 11, 2023, 3 pages.

* cited by examiner

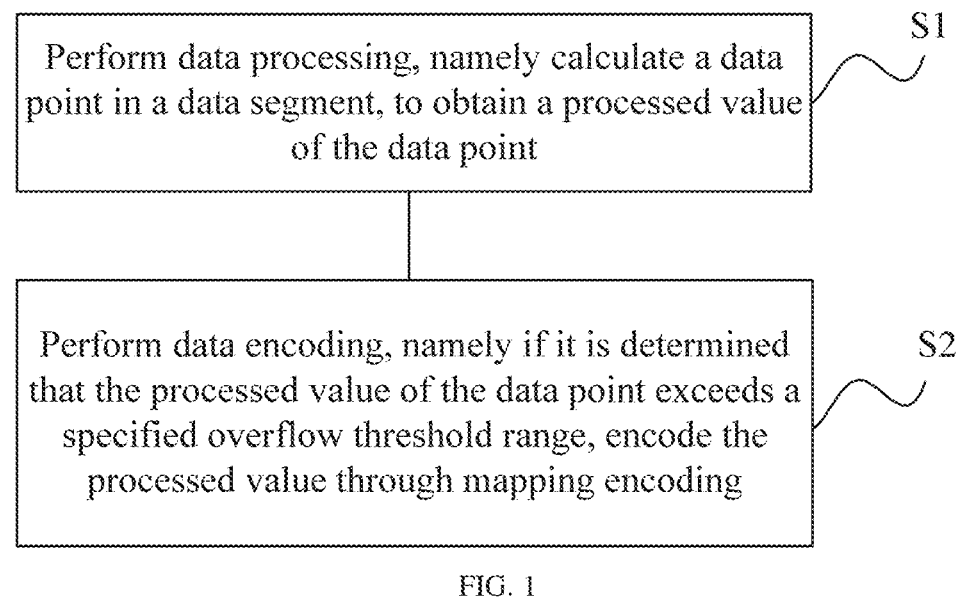

Perform data processing, namely calculate a data point in a data segment, to obtain a processed value of the data point    S1

Perform data encoding, namely if it is determined that the processed value of the data point exceeds a specified overflow threshold range, encode the processed value through mapping encoding    S2

FIG. 1

SIGNAL DETECTION METHOD, SIGNAL PROCESSING METHOD AND SIGNAL PROCESSING MODEL

TECHNICAL FIELD

The present disclosure relates to the technical field of signal detection, and in particular, to a signal detection method, a signal processing method, and a signal processing model.

BACKGROUND

For an analog front-end using a single-phase power supply, an acquired analog signal has a direct current (DC) bias, which significantly increases a dynamic range of original data, thereby requiring an analog-to-digital converter (ADC) with a wider bit width to complete high-fidelity analog-to-digital conversion. Existing signal transmission and storage methods do not detect or phase the signal, resulting in a wide bit width of the ADC. This imposes a high requirement for signal transmission and storage, which will inevitably increase a hardware cost.

SUMMARY

A technical problem to be solved in the present disclosure is to provide a signal detection method, a signal processing method, and a signal processing model.

The technical solutions used in the present disclosure to solve the technical problem thereof are as follows: A signal detection method includes: preprocessing a signal, namely processing a signal point in a signal segment, to obtain a processed value of the signal point; and detecting whether the processed value exceeds a specified overflow threshold range, to select a different reprocessing method based on a detection result of the processed value, where selecting the different reprocessing method based on the detection result of the processed value includes: when the processed value of the signal point exceeds the specified overflow threshold range, performing mapping encoding on the processed value of the signal point, where the mapping encoding includes: performing N iterative mapping operations on the processed value of the signal point until the processed value of the signal point is within the specified overflow threshold range, obtaining a mapped marker and a mapped value, and encoding the signal point into N mapped markers+M mapped values, where M represents a type of the mapped value, and $M \geq 1$.

Further, the processed value is a filtered value, or a residual value measured by a signal preprocessing model for the signal point; and the signal preprocessing model includes any one of an autoregressive (AR) model, a single-point differencing model, a periodic differencing model, and a model combining single-point differencing and periodic differencing, where when the signal is free from periodic interference and has a high sampling rate, the single-point differencing model is used to measure the residual value of the signal point; when the signal has periodic interference, the periodic differencing model is used to measure the residual value of the signal point; or when the signal has periodic interference and a high sampling rate, the model combining the single-point differencing and the periodic differencing is used to measure the residual value of the signal point.

Further, the residual value of the signal point measured according to the single-point differencing model is calculated by: residual value$_{single-point\ differencing}$=original value of a current signal point−original value of a previous signal point; the residual value of the signal point measured according to the periodic differencing model is calculated by: residual value$_{periodic\ differencing}$=original value of a current periodic segment−J×estimated value of the current periodic segment, where the estimated value of the current periodic segment=original value of a previous periodic segment, and J represents a coefficient; and the residual value of the signal point measured according to the model combining the single-point differencing and the periodic differencing is obtained by: combining the signal point into a plurality of periodic segments and measuring the residual value based on the periodic differencing, namely residual value$_{combined\ differencing}$=residual value$_{periodic\ difference}$(k)−residual value$_{periodic\ differencing}$(k−1), where k=2, 3, . . . , and K.

Further, the signal detection method further includes: performing phase detection on the signal segment before preprocessing the signal; and the phase detection includes: performing processing by sliding a window; detecting a fluctuation of the signal within the window; and detecting a phase of the signal based on a fluctuation result of the signal within the window.

Further, the fluctuation result of the signal within the window is represented as any one of a variance and a mean of the signal within the window, and a normalized line length of the signal within the window, where detecting the phase of the signal based on the variance and the mean of the signal within the window includes: obtaining the variance and the mean of the signal within the window, and determining that a signal segment with the variance not less than a second threshold is in a fluctuating phase, or determining that a signal segment with the variance less than the second threshold is in a stationary phase; and detecting the phase of the signal based on the normalized line length of the signal within the window includes: obtaining the normalized line length, namely measuring an average absolute value of a first-order difference of the signal within the window, where $$NLL = \frac{1}{A-1}\sum_{a=1}^{A-1}|x(a+1)-x(a)|,$$

A represents a quantity of signal points within the window, x(a) represents an $a^{th}$ signal point within the window, and a=1, 2, . . . , and A−1; and determining that a signal segment with the normalized line length exceeding an overflow threshold is in a fluctuating phase, and determining that a signal segment with the normalized line length not exceeding the overflow threshold is in a stationary phase.

The present disclosure further provides a signal processing method based on the above signal detection method. When M=1, the N iterative mapping operations each include a subtraction operation; or when M=2, the N iterative mapping operations each include any one of a logarithmic operation and a quotient-remainder operation.

Further, the subtraction operation is to subtract the overflow threshold from the processed value of the signal point; and if the mapped value is a difference obtained from a last subtraction operation, the signal point is encoded into the N mapped markers+the difference.

Further, the logarithmic operation is Z=log$_2$(D), where D represents the processed value, and the mapped value is a floating-point value Z obtained from a last logarithmic operation, with an integer part of the floating-point value Z being int(Z) and a decimal part of the floating-point value Z being Z-int(Z); and therefore, the signal point is encoded into the N mapped markers+the int(Z)+the Z-int(Z); and the quotient-remainder operation is to divide the processed value of the signal point by the overflow threshold, and the mapped value is a quotient value Q obtained from a last quotient-remainder operation and N remainders C obtained from N quotient-remainder operations; and therefore, the signal point is encoded into the N mapped markers+the quotient value Q+the N remainders C.

Further, the specified overflow threshold range is determined by the overflow threshold, where the overflow threshold is $-2^{n-1}$ or $2^{n-1}$, n represents an expected code bit width, and the specified overflow threshold range is $(-2^{n-1}, 2^{n-1})$; an n-bit overflow rate of a signal segment is set to be equal to a value of dividing a quantity of signal points with processed values exceeding the specified overflow threshold range in the signal segment by a total quantity of signal points in the signal segment; and when the signal segment is in the stationary phase and the n-bit overflow rate of the signal segment is less than a first threshold, mapping encoding based on the subtraction operation is selected to encode the processed value; when the signal segment is in the fluctuating phase and an average information entropy of the signal segment is less than a specified entropy threshold, mapping encoding based on the logarithmic operation is selected to encode the processed value; or when the signal segment is in the fluctuating phase and the average information entropy of the signal segment is not less than the specified entropy threshold, or when the signal segment is in the stationary phase and the n-bit overflow rate of the signal segment is greater than the first threshold, mapping encoding based on the quotient-remainder operation is selected to encode the processed value.

Further, the selecting the different reprocessing method based on the detection result of the processed value further includes: performing secondary encoding on a signal point obtained after the mapping encoding or a signal point with a processed value not exceeding the specified overflow threshold range, where the secondary encoding includes at least one of Huffman encoding, a variant of the Huffman encoding, arithmetic encoding, a variant of the arithmetic encoding, range encoding, a variant of the range encoding, and asymmetric digital systematic encoding.

The present disclosure further includes a signal processing model, including: a collection module configured to collect a signal; a processing module configured to execute the above signal processing method; and a storage module configured to store a processed signal.

The present disclosure achieves the following advantages: The signal processing method and the signal processing model in the present disclosure first preprocess a signal to obtain a processed value of a signal point, detect whether the processed value exceeds a specified overflow threshold range, and then select a different reprocessing method based on a detection result of the processed value. In this way, the signal is effectively processed in a targeted manner based on the detection result of the processed value, thereby effectively improving a processing effect of the signal.

BRIEF DESCRIPTION OF THE DRAWINGS

The present disclosure will be further described below in conjunction with the accompanying drawings and embodiments.

FIG. 1 is a flowchart of a signal processing method according to the present disclosure;

DETAILED DESCRIPTION OF THE
EMBODIMENTS

The present disclosure will be described in further detail below in combination with accompanying drawings. These accompanying drawings are all simplified schematic diagrams, which merely illustrate the basic structure of the present disclosure in a schematic manner, and thus only show the parts associated with the present disclosure.

In the description of the present disclosure, orientations or positional relationships indicated by terms such as "central", "longitudinal", "transverse", "long", "wide", "thick", "upper", "lower", "front", "rear", "left", "right", "vertical", "horizontal", "top", "bottom", "inner", "outer", "clockwise", "anticlockwise", "axial", "radial", and "circumferential" are based on the orientations or positional relationships shown in the accompanying drawings. These terms are only for convenience of describing the present disclosure and simplifying the description, rather than indicating or implying that the mentioned apparatus or element must have a particular orientation and be constructed and operated in a particular orientation, and therefore should not be construed as limiting the present disclosure. In addition, features defined with "first" and "second" may explicitly or implicitly include one or more of the features. In the description of the present disclosure, unless otherwise specified, "a plurality of" means two or more.

In the description of the present disclosure, it should be noted that, unless otherwise clearly specified, meanings of terms "installation", "interconnection", and "connection" should be understood in a board sense. For example, the "connection" may be a fixed connection, a removable connection, or an integral connection; may be a mechanical connection or an electrical connection; may be a direct connection or an indirect connection by using an intermediate medium; or may be intercommunication between two elements. Those of ordinary skill in the art may understand specific meanings of the foregoing terms in the present disclosure based on a specific situation.

Figure 2:
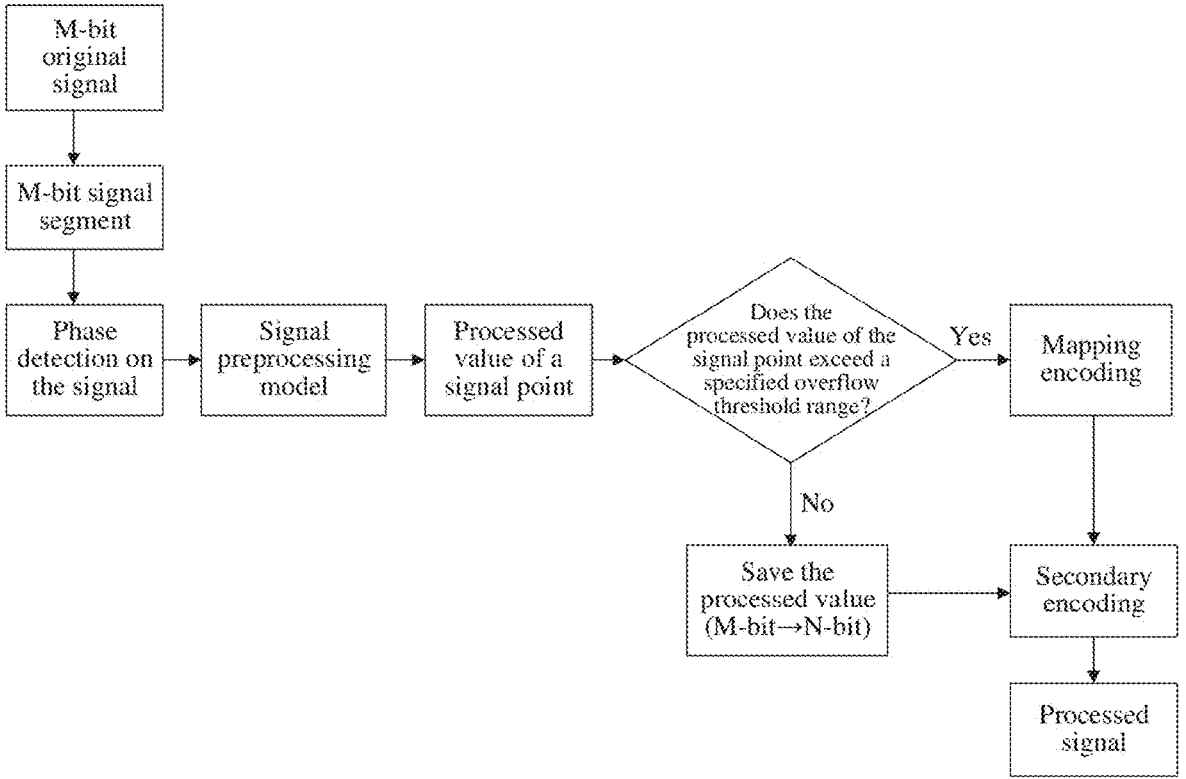
FIG. 2 shows a specific working process of a signal processing method according to the present disclosure.

As shown in FIG. 1 to FIG. 2, a signal processing method in the present disclosure includes the following steps: A signal detection method is first used to whether a processed value of a signal exceeds a specified overflow threshold range, and then a different reprocessing method is selected based on a detection result of the processed value. The signal detection method includes the following steps: S1. The signal is preprocessed, namely a signal point in a signal segment is processed, to obtain a processed value of the signal point. S2. Whether the processed value exceeds the specified overflow threshold range is detected, to select a different reprocessing method based on a detection result of the processed value. The selecting the different reprocessing method based on the detection result of the processed value includes: When a processed value of a signal point exceeds the specified overflow threshold range, mapping encoding is first performed on the processed value of the signal point, and then secondary encoding is performed. When the processed value of the signal point does not exceed the specified overflow threshold range, the secondary encoding is directly performed on the processed value of the signal point. The mapping encoding includes: N iterative mapping operations are performed on the processed value of the signal point until the processed value of the signal point is within the overflow threshold range, a mapped marker and a mapped value are obtained, and the signal point is encoded into N mapped markers+M mapped values, where M represents a type of the mapped value, and M≥1.

For example, as shown in FIG. 2, an M-bit original signal can be processed by sliding a window to obtain a plurality of M-bit signal segments. After phase detection is performed on the signal segments, a signal preprocessing model is used to calculate a processed value of a signal point. Then, it is determined whether the processed value of the signal point exceeds the overflow threshold range. If the processed value of the signal point exceeds the overflow threshold range, the mapping encoding is performed. If the processed value of the signal point does not exceed the overflow threshold range, the processed value is saved. Then, the secondary encoding is performed on both a processed value obtained after the mapping encoding and the directly saved processed value to obtain a final signal.

Optionally, the secondary encoding includes but is not limited to at least one of Huffman encoding, a variant of the Huffman encoding, arithmetic encoding, a variant of the arithmetic encoding, range encoding, a variant of the range encoding, and asymmetric digital systematic encoding. That is, an encoded signal can undergo the secondary encoding, such that the signal is further compressed.

It should be noted that the signal in the present disclosure may be any type of signal, for example, but not limited to, an electroencephalogram signal, an electromyographic signal, an electrocardiosignal, and other physiological signals, or may be an image signal, software data, and other storable data. After an original signal is obtained, it can be sliced into a plurality of signal segments. Then, the phase detection is performed on the signal segments, and a phase of the signal is labeled based on a fluctuation. After that, signal preprocessing and encoding are performed on a signal point in each segment to obtain a compressed signal. The processed value is a residual value measured by the signal preprocessing model for the signal point or a filtered value. Processed values of all signal points in the signal segment are determined. If a processed value of a signal point does not exceed the specified overflow threshold range, no encoding is performed. If a processed value of a signal point exceeds the specified overflow threshold range, the signal encoding is required to reduce space occupied by the signal. An encoding method for the signal point is "the N mapped markers+the M mapped values", where the mapped marker is used to facilitate subsequent decoding of the compressed signal, and there is at least one type of mapped value.

For example, when M=1, the mapping operation includes a subtraction operation. The subtraction operation is to subtract an overflow threshold from the processed value of the signal point. If the mapped value is a difference obtained from a last subtraction operation, the signal point is encoded into the N mapped markers+the difference. That is, when M=1, the mapped value is a difference of the subtraction operation, and the processed value of the signal point is subtracted by the overflow threshold to obtain a difference of a first subtraction operation. If the difference of the first subtraction operation still exceeds the overflow threshold range, the subtraction operation is continuously performed on the difference until an obtained difference is within the overflow threshold range. During the encoding, the mapped marker may be a character, N represents a quantity of subtraction operations performed, and the mapped value is the difference obtained from the last subtraction operation.

For example, when M=2, the mapping operation includes any one of a logarithmic operation and a quotient-remainder operation. The logarithmic operation is $Z=\log_2(D)$, where D represents the processed value. The mapped value is a floating-point value Z obtained from a last logarithmic operation, with an integer part of the floating-point value Z being int(Z) and a decimal part of the floating-point value Z being Z-int(Z). Therefore, the signal point is encoded into the N mapped markers+the int(Z)+Z-int(Z). The quotient-remainder operation is to divide the processed value of the signal point by the overflow threshold, the mapped value is a quotient value Q obtained from a last quotient-remainder operation and N remainders C obtained from N quotient-remainder operations. Therefore, the signal point is encoded into the N mapped markers+the quotient value Q+the N remainders C. That is, when the logarithmic operation is performed, if a floating-point value obtained by performing the logarithmic operation on the processed value of the signal point still exceeds the overflow threshold range, the logarithmic operation is continuously performed on the floating-point value until an obtained floating-point value is within the overflow threshold range. During the encoding, the mapped marker may be the character, and N represents a quantity of logarithmic operations performed. The mapped value includes the integer part int(Z) and the decimal part Z-int(Z). Additionally, during the encoding, the integer part int(Z) only occupies one byte, while the decimal part Z-int (Z) may occupy a plurality of bytes. When the quotient-remainder operation is performed, the processed value of the signal point is divided by the overflow threshold to obtain the quotient value Q and the remainder C. If the quotient value Q still exceeds the overflow threshold range, the quotient Q is continuously divided by the overflow threshold until an obtained quotient value Q is within the overflow threshold range. During the encoding, the mapped marker may be the character, and N represents a quantity of quotient-remainder operations performed. The mapped value includes the quotient value Q and the remainder C. The quotient value Q is a quotient value obtained from a last division operation, while all the remainders C are retained. The quotient-remainder operation performs a division operation to map the signal point into a smaller quotient value and remainder.

It should be noted that a value of the N in the above three operations may be the same or different. The encoding method in the present disclosure can compress a data volume of the signal as much as possible while preserving a feature of the signal, thereby further improving a compression ratio.

In the present disclosure, the overflow threshold range is determined by the overflow threshold. The overflow threshold is $-2^{n-1}$ or $2^{n-1}$, where n represents an expected code bit width, and the overflow threshold range is $(-2^{n-1}, 2^{n-1})$, excluding endpoints. When the overflow threshold participates in the mapping operation, a value of the overflow threshold depends on whether a number with a largest absolute value in a signed numerical value of a computer is positive or negative. In other words, the value of the overflow threshold depends on a signal range that an n-bit signed signal of the computer can represent. If the signal range is $(-2^{n-1}, 2^{n-1}]$, the overflow threshold is taken as $2^{n-1}$. If the signal range is $[-2^{n-1}, 2^{n-1})$, the overflow threshold is taken as $-2^{n-1}$, but when a same computer performs signal compression, the value of the overflow threshold should be uniformly positive or negative. The processed value is encoded through the mapping encoding. Specifically, an n-bit overflow rate of a signal segment is set to be equal to a value obtained by dividing a quantity of signal points whose processed values exceed the overflow threshold range in the signal segment by a total quantity of signal points in the signal segment. When the signal segment is in a stationary phase and the n-bit overflow rate of the signal segment is less than a first threshold, the mapping encoding when M=1 is selected to encode the processed value. When the signal segment is in a fluctuating phase and an average information entropy of the signal segment is less than a specified entropy threshold, the logarithmic operation for the mapping encoding when M=2 is selected to encode the processed value. When the signal segment is in the fluctuating phase and the average information entropy of the signal segment is not less than the specified entropy threshold, or when the signal segment is in the stationary phase and the n-bit overflow rate of the signal segment is greater than the first threshold, the quotient-remainder operation for the mapping encoding when M=2 is selected to encode the processed value. For example, the first threshold is 1% to 10%, and is preferably 3%, 5%, or 7%. That is, the signal encoding method can be selected based on the n-bit overflow rate of the signal point in the signal segment, a signal fluctuation status (the stationary or fluctuating phase), and the average information entropy of the signal segment. An appropriate encoding method is selected based on characteristics of the signal. For example, a signal in the stationary phase has a small overflow rate, and therefore there is no need to perform the logarithmic operation or the residual-remainder operation because they have relatively large computational complexity. This can better compress the signal, save measurement resources, improve efficiency, and preserve an important feature of the signal.

Figure 3:
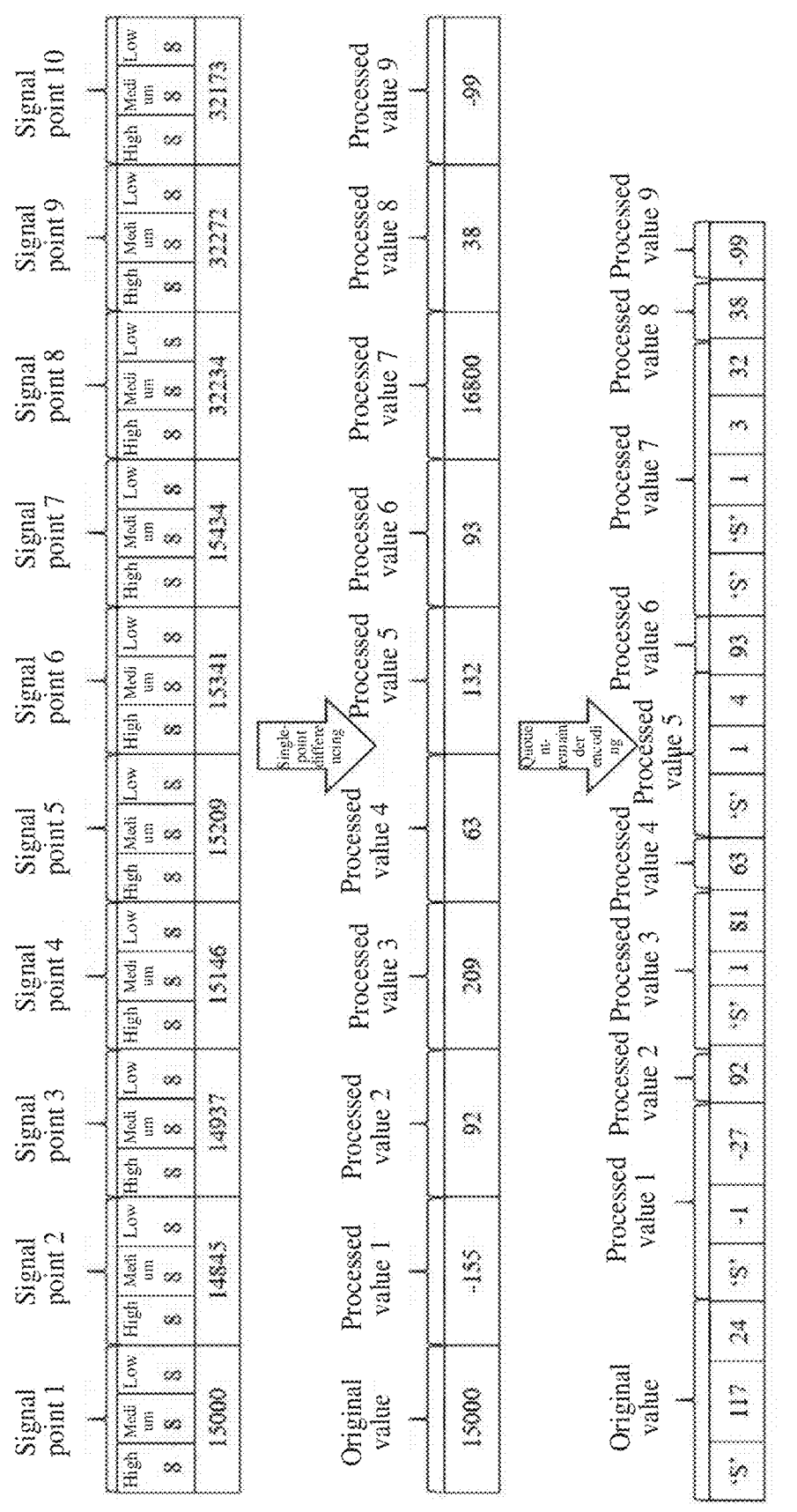
FIG. 3 is a schematic diagram of encoding based on a quotient-remainder operation according to the present disclosure.

For example, as shown in FIG. 3, n=8, the overflow threshold is −128 or 128, and the overflow threshold range is (−128, 128). Assuming an original signal point has 24 bits and a signal segment contains ten signal points, single-point differencing is performed on the signal points in the signal segment to obtain nine residual values, with an overflow rate of 50%. Therefore, the quotient-remainder operation can be selected to encode ten signal points (one original value+nine residual values) in a processed signal segment. When the quotient-remainder operation is performed, the overflow threshold may be set to 128, with a first signal point numbered 15000. A value of dividing 15000 by 128 is 117 (within the overflow threshold range), with a remainder of 24. Therefore, the signal point 15000 is encoded into "S+117+24", where S is the mapped marker. A value of dividing a signal point 16800 by 128 is 131, with a remainder of 32, but the quotient value 131 still exceeds the overflow threshold range. Therefore, the division operation is continuously performed on the quotient value 131. A value of dividing 131 by 128 is 1 (within the overflow threshold range), with a remainder of 3. Therefore, the signal point 16800 is encoded into "S+S+1+3+32". Codes of all the signal points in the signal segment can be obtained through the quotient-remainder operation (as shown in FIG. 3). After the signal encoding, the ten signals occupy 22 bytes instead of originally 30 bytes, effectively reducing semaphores and saving storage space. Moreover, the quotient-remainder operation is a kind of lossless compression, where a quantity of bits in an encoded signal is equal to a quantity of bits in the original signal. In this way, after decoding, an effective signal (retaining an original feature) can still be obtained for subsequent analysis and processing.

For example, according to the signal detection method, the phase detection is performed on the signal segment before preprocessing the signal. The phase detection includes: Processing is performed through the sliding window; a fluctuation of the signal within the window is detected; and a phase of the signal is detected based on a fluctuation result of the signal within the window. That is, before the signal preprocessing, the signal segment can be classified to determine whether the signal segment is in the stationary or fluctuating phase, and then the signal preprocessing and selective reprocessing can be carried out based on a classification result of the signal segment. This can further improve a processing effect of the signal, that is, a compression effect and compression efficiency after the signal processing.

The fluctuation of the signal within the window is represented as any one of a variance and a mean of the signal within the window and a normalized line length of the signal within the window. When the phase of the signal is detected based on the variance and the mean of the signal within the window, the variance and the mean of the signal within the window are obtained, and it is determined that a signal segment whose variance is not less than a second threshold is in a fluctuating phase, and it is determined that a signal segment whose variance is less than the second threshold is in a stationary phase. The second threshold is 2 to 10 times a mean variance of the signal within the window, and is preferably 3 times, 5 times, or 8 times the mean variance of the signal within the window.

When the phase of the signal is detected based on the normalized line length of the signal within the window, the normalized line length is obtained, that is, an average absolute value of a first-order difference of the signal within the window is measured, where $$NLL = \frac{1}{A-1}\sum_{a=1}^{A-1}|x(a+1)-x(a)|,$$

A represents a quantity of signal points within the window, x(a) represents an $a^{th}$ signal point within the window, and a=1, 2, . . . , and A−1; and it is determined that a signal segment whose normalized line length exceeds the overflow threshold is in a fluctuating phase, and it is determined that a signal segment whose normalized line length does not exceed the overflow threshold is in a stationary phase.

Specifically, in the present disclosure, when the processed value is the filtered value, the processed value is filtered mainly through low-pass filtering or high-pass filtering to eliminate background noise unrelated to the target signal. When the processed value is the residual value, the adopted signal preprocessing model mainly includes any one of an AR model, a single-point differencing model, a periodic differencing model, and a model combining single-point differencing and periodic differencing. When the signal is free from periodic interference and has a high sampling rate, the single-point differencing model is used to measure the residual value of the signal point. When the signal has the periodic interference, the periodic differencing model is used to measure the residual value of the signal point. When the signal has the periodic interference and the high sampling rate, the model combining the single-point differencing and the periodic differencing is used to measure the residual value of the signal point.

For example, an expression of the AR model is as follows:

$$y[t] = \varphi_1 y[t-1] + \varphi_2 y[t-2] + \ldots + \varphi_P y[t-P] + \varepsilon[t] = \hat{y}[t] + \varepsilon[t],$$

where, $t=P+1 \ldots K$, $\varphi_1{\sim}\varphi_p$ represent coefficients of a P-order centralized AR model, and $\varepsilon[t]=y[t]-\hat{y}[t]$ represents a residual between the original signal and its estimated value. For the signal compression, obtaining the $\varphi_1{\sim}\varphi_p$ to minimize the residual $\varepsilon[t]$ is a key to improving the compression ratio. A residual vector of the signal segment is as follows:

$$\varepsilon = \begin{bmatrix} \varepsilon[P+1] \\ \vdots \\ \varepsilon[K] \end{bmatrix} = \begin{bmatrix} y[P+1] \\ \vdots \\ y[K] \end{bmatrix} - \begin{bmatrix} y[P] & \ldots & y[1] \\ \vdots & \ddots & \vdots \\ y[K-1] & \ldots & y[K-P] \end{bmatrix} \begin{bmatrix} \varphi_1 \\ \vdots \\ \varphi_P \end{bmatrix} = y = Y\varphi,$$

and a coefficient for minimizing the AR model can be expressed as follows:

$$\varphi = \arg\min_{\varphi} \|y - Y\varphi\|_2 = \left(Y^T Y\right)^{-1} Y^T y.$$

For example, if $P=1$ and $\varphi_{i=1}$, the above P-order centralized AR model can be expressed as follows:

$$\varepsilon[t] = y[t] - y[t-1], t = 2, \ldots, K,$$

that is, the single-point differencing model is obtained. The single-point differencing model can reduce an overflow rate of the residual value.

For example, if $K=2P$, $P=T{\times}F_s$, $\varphi_P=w$, and $\varphi_{P-1}=\varphi_1=0$, the above P-order centralized AR model can be expressed as follows:

$$\varepsilon[t] = y[t] - \omega \cdot y[t-P], t = P+1, \ldots, 2P,$$

that is, the periodic differencing model is obtained, where T represents a maximum interference period, Fs represents a sampling rate, and w represents a trend compensation coefficient, which can reflect a change rate of overall replication between two consecutive periods. The periodic differencing model can remove periodic interference from the original signal, thereby reducing the overflow rate of the residual value.

The single-point differencing model and the periodic differencing model do not need to dynamically solve the coefficient $\varphi$, which can significantly improve measurement efficiency. Because the coefficient $\varphi$ does not need to be solved, the storage space can also be saved. In a practical application, the signal preprocessing model can be selected based on whether there is the periodic interference in the signal and the sampling rate.

Specifically, the residual value of the signal point measured according to the single-point differencing model is calculated by: residual value$_{single\text{-}point\ differencing}$=original value of a current signal point-original value of a previous signal point. The residual value of the signal point measured according to the periodic differencing model is calculated by: residual value$_{periodic\ differencing}$=original value of a current periodic segment−J×estimated value of the current periodic segment, where the estimated value of the current periodic segment=original value of a previous periodic segment, and J represents a coefficient. The residual value of the signal point measured according to the model combining the single-point differencing and the periodic differencing is obtained by: combining the signal point into a plurality of periodic segments and measuring the residual value based on the periodic differencing, namely residual value$_{combined\ differencing}$=residual value$_{periodic\ differencing}$ (k)− residual value$_{periodic\ differencing}$(k−1), k=2, 3, . . . , and K.

Figure 4:
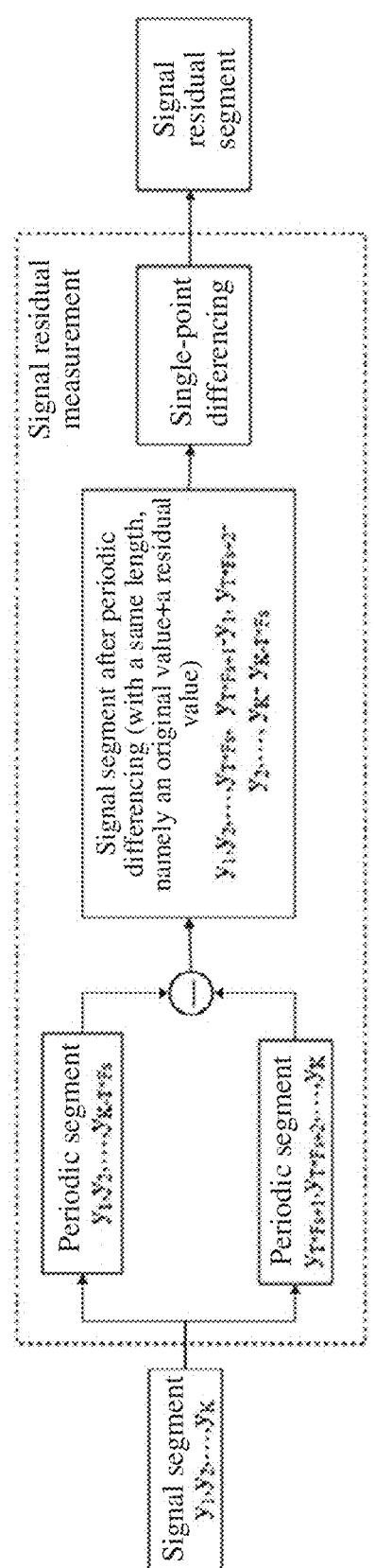
FIG. 4 is a schematic diagram of periodic differencing and single-point differencing operations according to the present disclosure.

For example, as shown in FIG. 4, T=1/50 or 1/60 (a maximum interference period of a power frequency), and a quantity of signal points corresponding to the maximum interference period is T×Fs. It is assumed that a signal segment contains a total of K signal points, namely $y_1$, $y_2$, . . . , $y_K$. The K signal points are divided into a plurality of periodic segments by taking T×Fs as one period, namely $y_1$, $y_2$, . . . , $y_{K-T*Fs}$ and $y_{T*Fs+1}$, $y_{T*Fs+2}$, . . . , $y_K$. An original value of a previous periodic segment is used as an estimated value of a current periodic segment, and residual values of second to last periodic segments are measured based on the periodic differencing model. An original value of a first periodic segment and the residual values of the second to last periodic segments are combined to form a new signal segment $y_1$, $y_2$, . . . , $y_{T*Fs}$, $y_{T*Fs+1}{-}y_1$, $y_{T*Fs+2}{-}y_K{-}y_K{-}$ $y_{K-T*Fs}$, and the new signal segment has a same length as the original signal segment. Then, the single-point differencing is performed on a signal point in the new signal segment to obtain a final signal residual segment.

Figure 5:
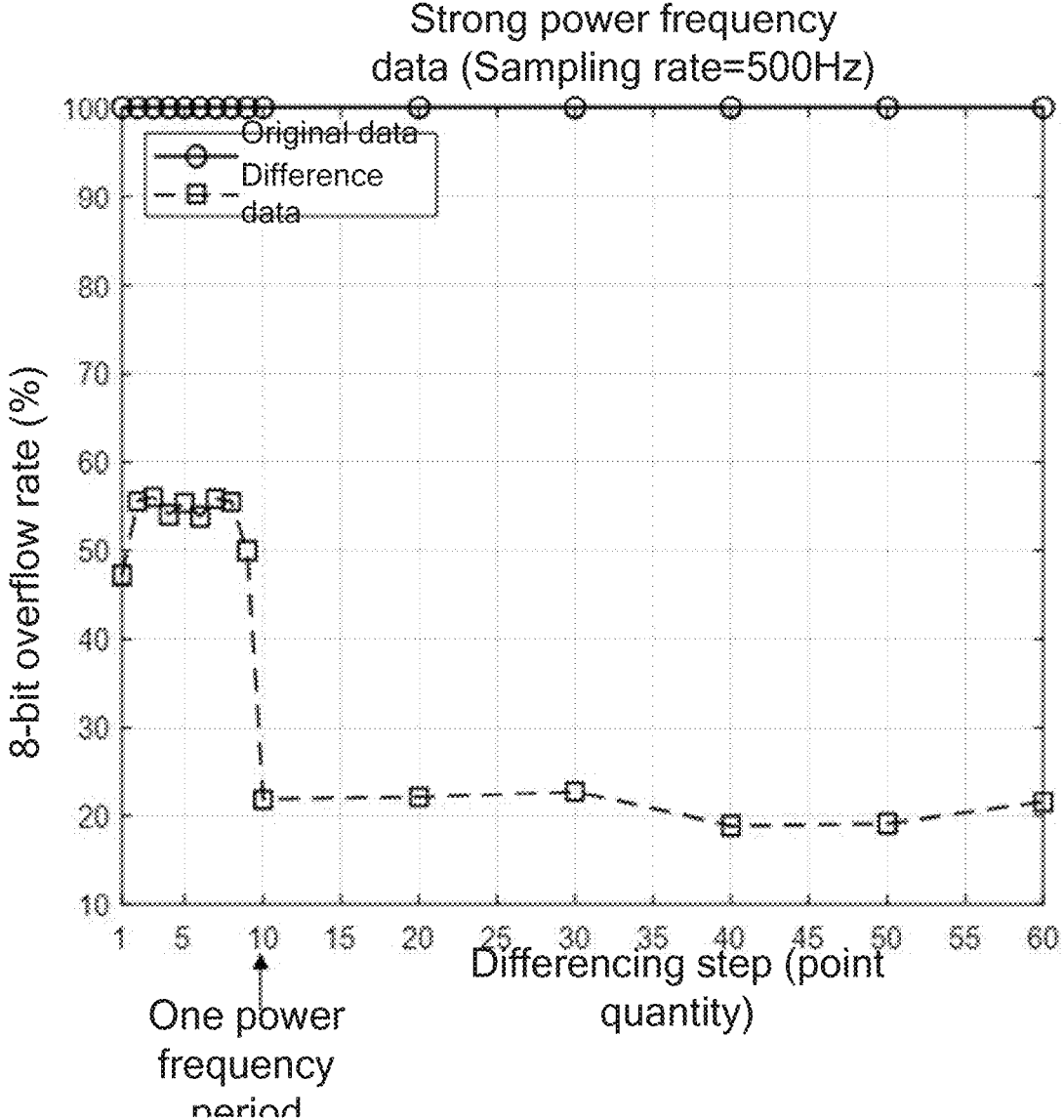
FIG. 5 is a comparative diagram of overflow rates of different signal preprocessing models according to the present disclosure.
Figure 6:
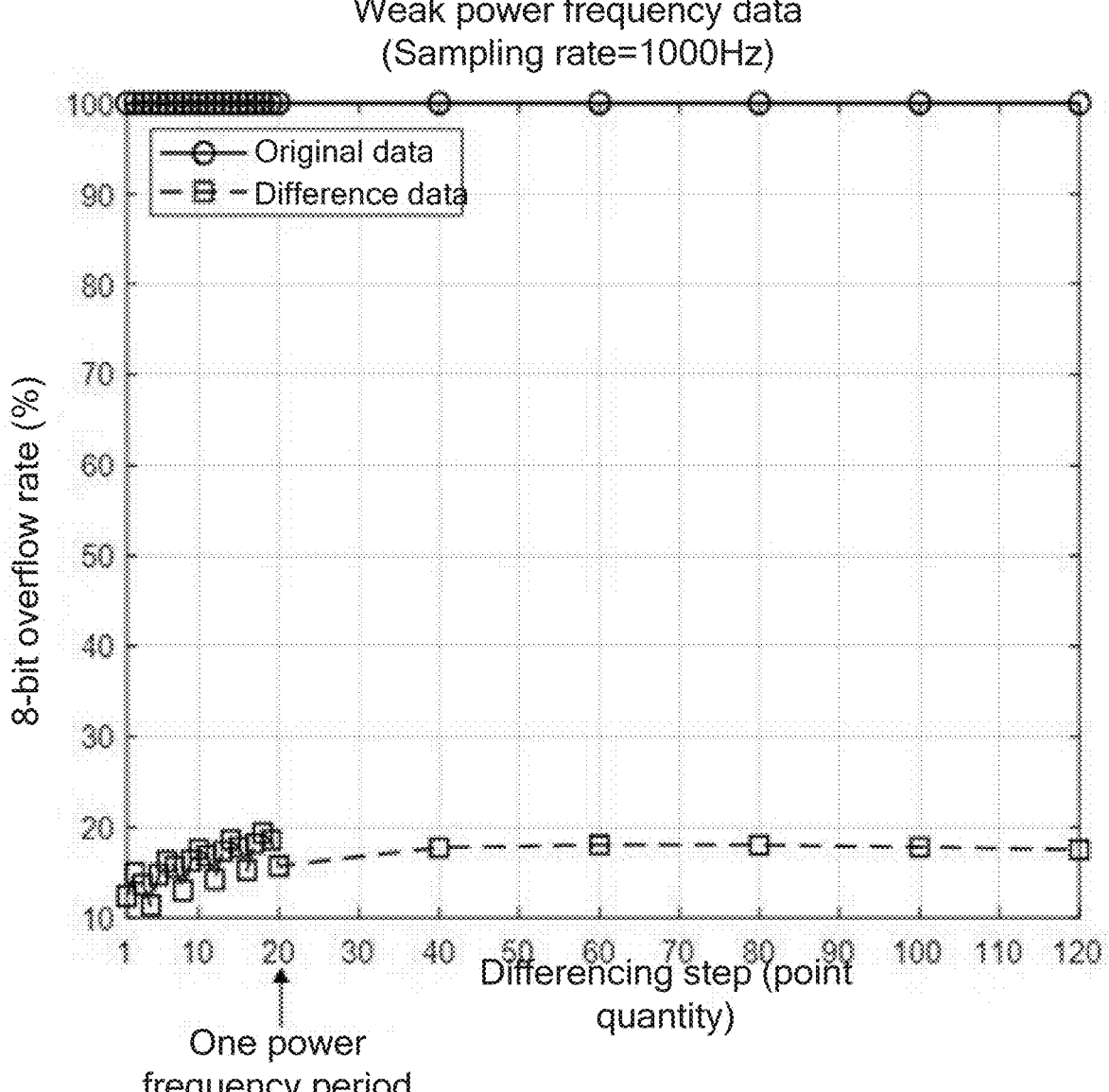
FIG. 6 is another comparative diagram of overflow rates of different signal preprocessing models according to the present disclosure.

An 8-bit overflow rate of the signal residual segment measured by combining the periodic differencing and single-point differencing decreases compared with that of the original signal. As shown in FIG. 5, for a strong power frequency signal (with a sampling rate of 500 Hz), with 10 points as one power frequency period, an overflow rate of original data is 100%, an overflow rate obtained through the single-point differencing (namely, difference data of a first period) is about 47%, and an overflow rate obtained through the periodic differencing+single-point differencing is about 22%, which is significantly better than that obtained through the single-point differencing. As shown in FIG. 6, for a weak power frequency signal (with a sampling rate of 1000 Hz), with 20 points as one power frequency period, an overflow rate obtained through the single-point differencing (namely, difference data of a first period) is about 12%, while an overflow rate obtained through the periodic differencing+ single-point differencing is about 16%, slightly higher than that obtained through the single-point differencing. For 50

Hz/60 Hz power frequency interference, the combination of the periodic differencing and the single-point differencing has significant advantages.

Advantages of the present disclosure will be described below with reference to specific embodiments.

Embodiment 1

Figure 7:
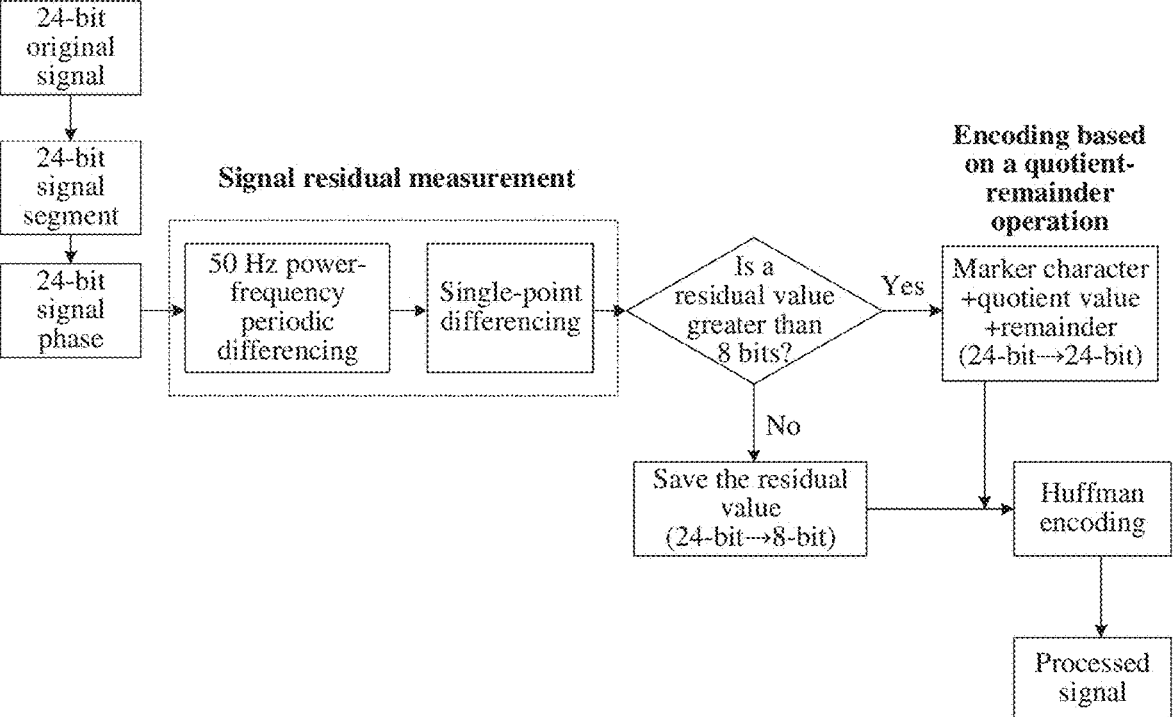
FIG. 7 shows a processing procedure of Embodiment 1 according to the present disclosure.

As shown in FIG. 7, a 24-bit original signal is used and sliced to obtain a 24-bit signal segment. A residual value of the 24-bit signal segment is measured by combining the periodic differencing and the single-point differencing, and the residual value is encoded through the quotient-remainder operation. The Huffman encoding is used for the secondary encoding to obtain a final processed signal segment. After the encoding based on the quotient-remainder operation, a signal point still occupies 24 bits.

Embodiment 2

Figure 8:
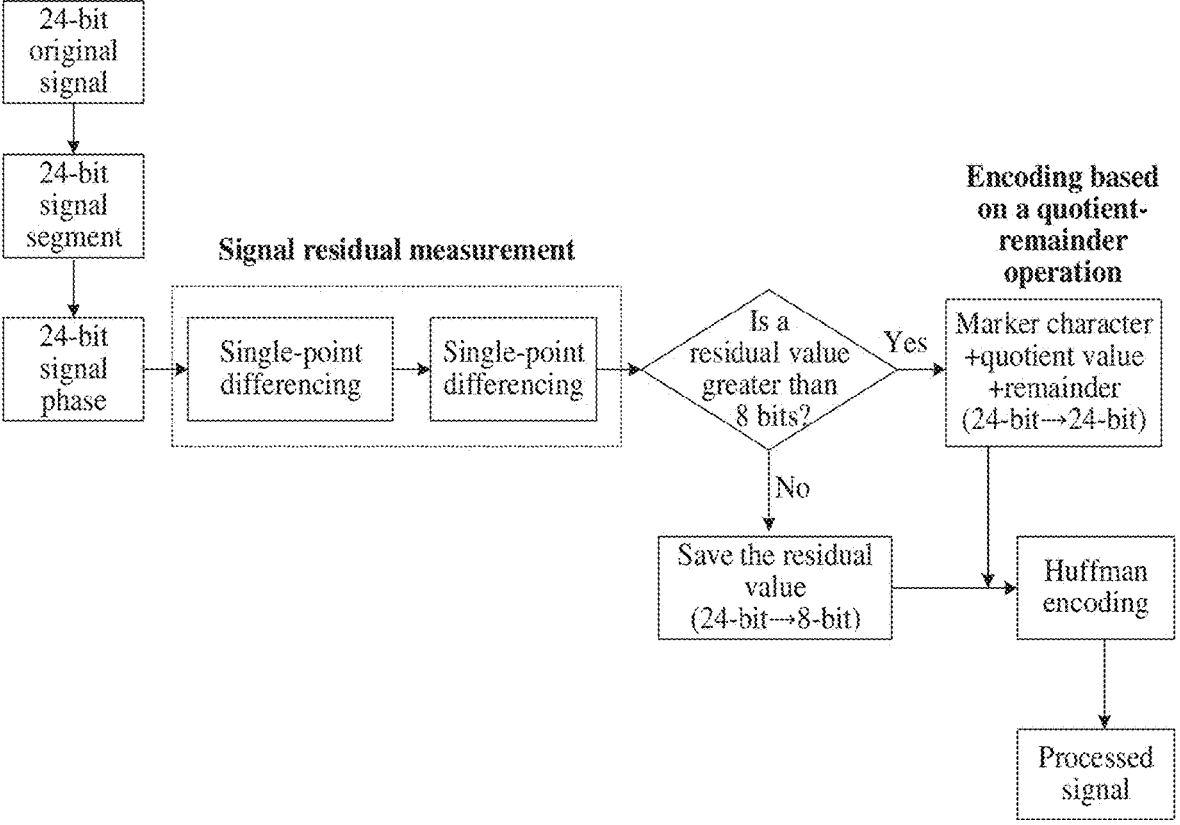
FIG. 8 shows a processing procedure of Embodiment 2 according to the present disclosure.

As shown in FIG. 8, in Embodiment 2, a residual value of a 24-bit signal segment is measured by performing the single-point differencing twice, which is different from that in Embodiment 1.

Embodiment 3

Figure 9:
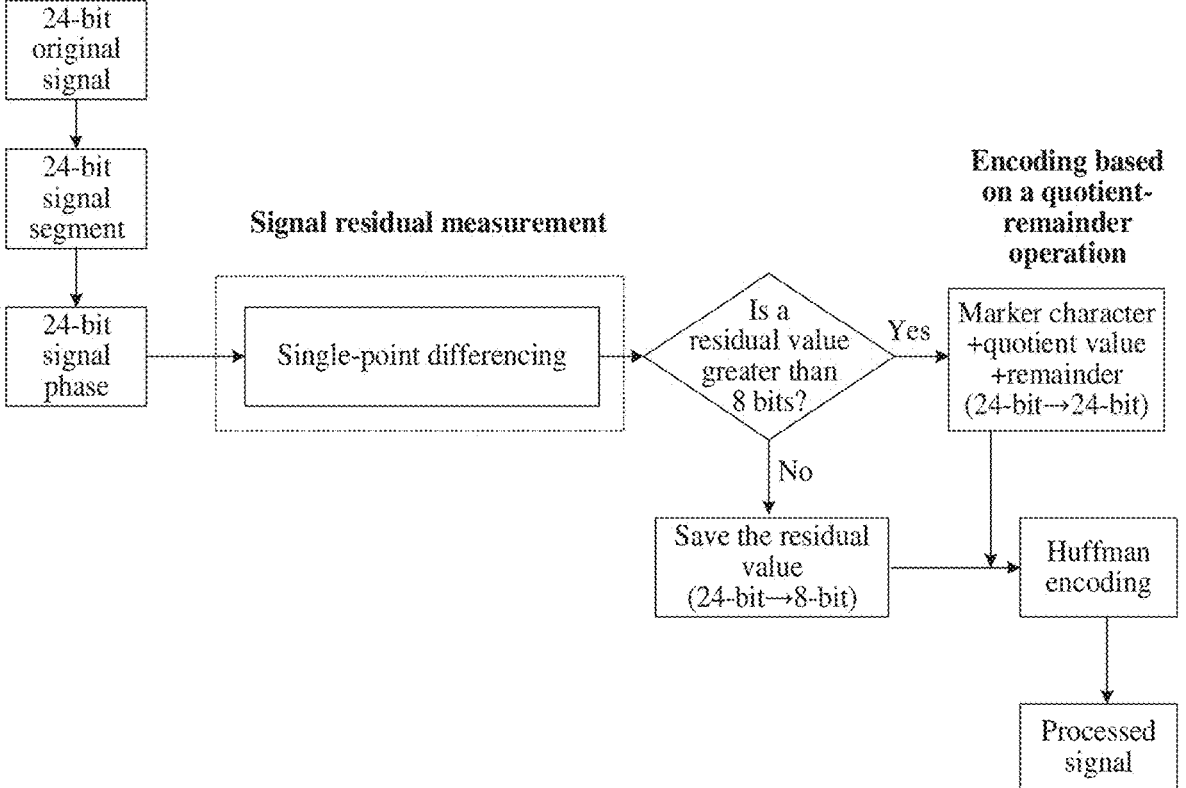
FIG. 9 shows a processing procedure of Embodiment 3 according to the present disclosure.

As shown in FIG. 9, in Embodiment 3, a residual value of a 24-bit signal segment is measured through the single-point differencing, which is different from that in Embodiment 1.

Comparative Example

Figure 10:
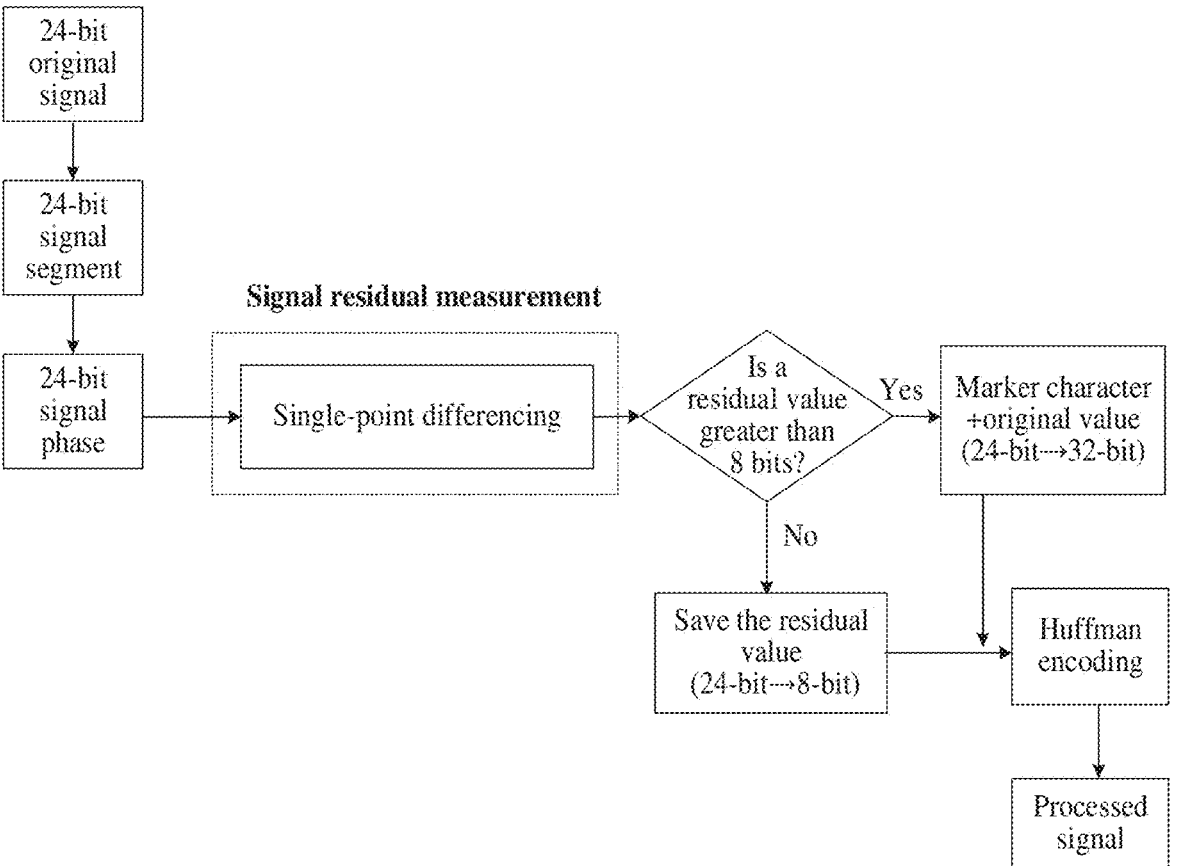
FIG. 10 shows a processing procedure of a comparative example.

As shown in FIG. 10, the comparative example (namely the prior art) uses a 24-bit original signal and slices the original signal to obtain a 24-bit signal segment. A residual value of the 24-bit signal segment is measured through the single-point differencing, and the residual value is encoded through the Huffman encoding. The Huffman encoding is used for the secondary encoding to obtain a final processed signal segment. After the Huffman encoding is performed for the first time, bits occupied by a signal point increase to 32 bits from 24 bits, which actually increases a workload of the signal compression.

Figure 11:
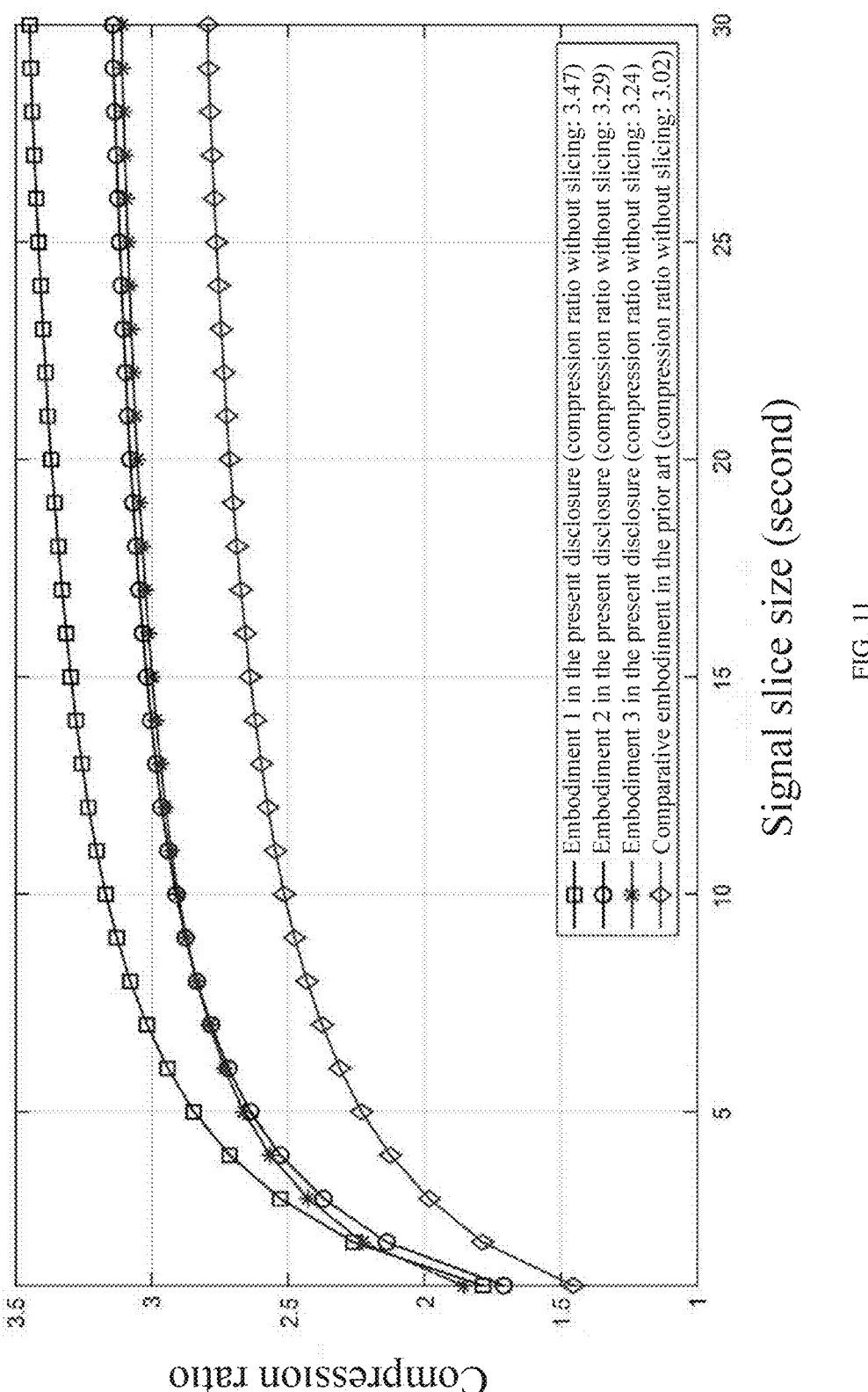
FIG. 11 shows compression ratio change curves of embodiments in the present disclosure and a comparative example.
Figure 12:
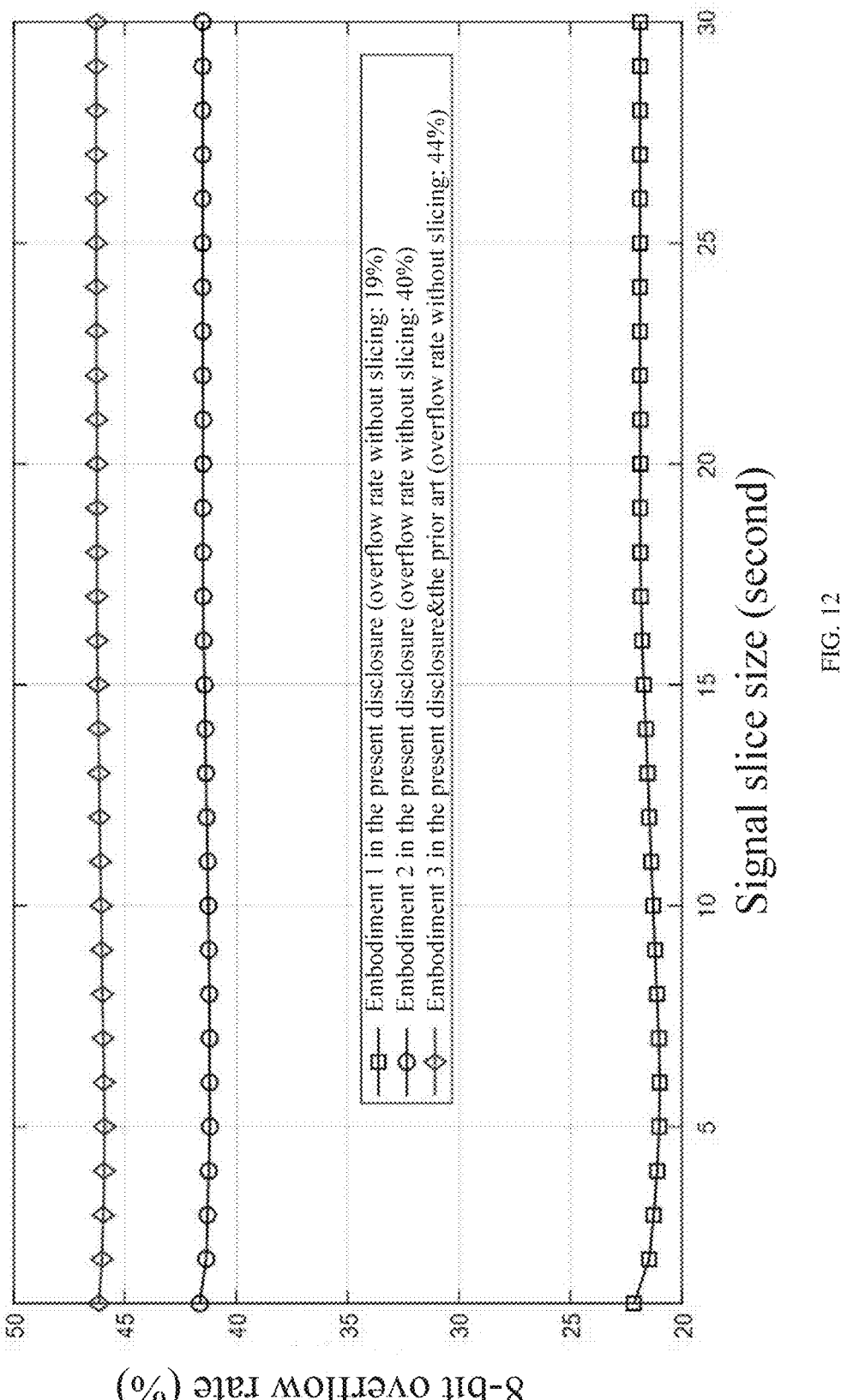
FIG. 12 shows overflow rate change curves of embodiments in the present disclosure and a comparative example.

From FIG. 11, it can be seen that a compression ratio is stable at around 3.47 in Embodiment 1, at around 3.29 in Embodiment 2, at around 3.24 in Embodiment 3, and at around 3.02 in the comparative example. Embodiment 1 to Embodiment 3 and the comparative example are compared, and the signal compression ratios in the three embodiments are higher than the signal compression ratio in the comparative example. Moreover, the signal compression ratios in the three embodiments meet a following condition: the compression ratio in Embodiment 1>the compression ratio in Embodiment 2>the compression ratio in Embodiment 3. This indicates that the signal processing method in the present disclosure can improve a storage compression ratio of the signal by 7.2% to 15% compared with the prior art. Moreover, the storage compression ratio is positively correlated with a length of the signal segment. After the length of the signal segment exceeds 15 seconds, the storage compression ratio tends to be stable. As shown in FIG. 12, an overflow rate is about 19% in Embodiment 1, about 40% in Embodiment 2, about 44% in Embodiment 3, and about 44% in the comparative example. From this, it can be seen that an 8-bit overflow rate in Embodiment 1 is significantly lower than 8-bit overflow rates in Embodiment 2, Embodiment 3, and the comparative example. This indicates that the combination of the periodic differencing and the single-point differencing can effectively reduce the overflow rate of the signal, thereby effectively reducing a quantity of signal encoding operations, improving the storage compression ratio, and also enhancing compression efficiency.

The present disclosure further includes a signal processing model, including: a collection module configured to input or collect a signal; a processing module configured to execute the above signal processing method; and a storage module configured to store a processed signal.

In summary, the signal detection method, the signal processing method, and the signal processing model in the present disclosure preprocess a signal to obtain a processed value of a signal point, check whether the processed value exceeds a specified overflow threshold range, and select a different reprocessing method based on a detection result of the processed value. In this way, the original signal can be effectively processed, thereby further improving a compression ratio and compression efficiency of the signal, significantly saving storage space, and thus reducing a storage cost for an enterprise. Therefore, the present disclosure has high application value.

Under the inspiration of the above ideal embodiments of the present disclosure, a skilled person can absolutely make various changes and modifications based on the above description content without departing from the scope of the technical idea of the present disclosure. The technical scope of the present disclosure is not limited to the content of this specification, which must be determined according to the scope of the claims.

The invention claimed is:

1. A signal detection method, comprising:
preprocessing a signal, namely processing a signal point in a signal segment, to obtain a processed value of the signal point; and
detecting whether the processed value exceeds a specified overflow threshold range, to select a different reprocessing method based on a detection result of the processed value,
wherein selecting the different reprocessing method based on the detection result of the processed value comprises:
when the processed value of the signal point exceeds the specified overflow threshold range, performing mapping encoding on the processed value of the signal point, wherein the mapping encoding comprises:
performing N iterative mapping operations on the processed value of the signal point until the processed value of the signal point is within the specified overflow threshold range, obtaining a mapped marker and a mapped value, and encoding the signal point into N mapped markers+M mapped values, wherein M represents a type of the mapped value, and $M \geq 1$.

2. The signal detection method according to claim 1, wherein:
the processed value is a filtered value, or a residual value measured by a signal preprocessing model for the signal point; and
the signal preprocessing model comprises any one of an autoregressive (AR) model, a single-point differencing model, a periodic differencing model, or a model combining single-point differencing and periodic differencing, wherein

13 when the signal is free from periodic interference and has a high sampling rate, the single-point differencing model is used to measure the residual value of the signal point;

when the signal has periodic interference, the periodic differencing model is used to measure the residual value of the signal point; and when the signal has periodic interference and a high sampling rate, the model combining the single-point differencing and the periodic differencing is used to measure the residual value of the signal point.

3. The signal detection method according to claim 2, wherein:

the residual value of the signal point measured according to the single-point differencing model is calculated by: residual value$_{single\text{-}point\ differencing}$=original value of a current signal point−original value of a previous signal point;

the residual value of the signal point measured according to the periodic differencing model is calculated by: residual value$_{periodic\ differencing}$=original value of a current periodic segment−J×estimated value of the current periodic segment, wherein the estimated value of the current periodic segment=original value of a previous periodic segment, and J represents a coefficient; and the residual value of the signal point measured according to the model combining the single-point differencing and the periodic differencing is obtained by: combining the signal point into a plurality of periodic segments and measuring the residual value based on the periodic differencing, namely residual value$_{combined\ differencing}$=residual value$_{periodic\ differencing}$ (k)−residual value$_{periodic\ differencing}$ (k−1), wherein k=2, 3, . . . , and K.

4. The signal detection method according to claim 1, wherein:

the signal detection method further comprises: performing phase detection on the signal segment before preprocessing the signal; and the phase detection comprises:

performing processing by sliding a window;

detecting a fluctuation of the signal within the window; and detecting a phase of the signal based on a fluctuation result of the signal within the window.

5. The signal detection method according to claim 4, wherein:

the fluctuation result of the signal within the window is represented as any one of a variance and a mean of the signal within the window, and a normalized line length of the signal within the window;

detecting the phase of the signal based on the variance and the mean of the signal within the window comprises: measuring the variance and the mean of the signal within the window; and determining that a signal segment with the variance not less than a second threshold is in a fluctuating phase, and determining that a signal segment with the variance less than the second threshold is in a stationary phase; and detecting the phase of the signal based on the normalized line length of the signal within the window comprises: obtaining the normalized line length, namely measuring an average absolute value of a first-order difference of the signal within the window as follows:

14

$$NLL = \frac{1}{A-1}\sum_{a=1}^{A-1}|x(a+1)-x(a)|,$$

wherein, A represents a quantity of signal points within the window, x(a) represents an $a^{th}$ signal point within the window, and a=1, 2, . . . , and A−1; and determining that a signal segment with the normalized line length exceeding an overflow threshold is in the fluctuating phase, and determining that a signal segment with the normalized line length not exceeding the overflow threshold is in the stationary phase.

6. A signal processing method based on the signal detection method according to claim 1, wherein:

when M=1, the N iterative mapping operations each comprise a subtraction operation; and when M=2, the N iterative mapping operations each comprise any one of a logarithmic operation or a quotient-remainder operation.

7. The signal processing method according to claim 6, wherein:

the subtraction operation is to subtract an overflow threshold from the processed value of the signal point; and when the mapped value is a difference obtained from a last subtraction operation, the signal point is encoded into the N mapped markers+the difference.

8. The signal processing method according to claim 6, wherein:

the logarithmic operation is Z=log$_2$(D), wherein D represents the processed value, and the mapped value is a floating-point value Z obtained from a last logarithmic operation, with an integer part of the floating-point value Z being int(Z) and a decimal part of the floating-point value Z being Z−int(Z); and the signal point is encoded into the N mapped markers+the int(Z)+the Z−int(Z); and the quotient-remainder operation is to divide the processed value of the signal point by an overflow threshold, and the mapped value is a quotient value Q obtained from a last quotient-remainder operation and N remainders C obtained from N quotient-remainder operations; and the signal point is encoded into the N mapped markers+the quotient value Q+the N remainders C.

9. The signal processing method according to claim 7, wherein:

the specified overflow threshold range is determined by the overflow threshold, wherein the overflow threshold is $-2^{n-1}$ or $2^{n-1}$, n represents an expected code bit width, and the specified overflow threshold range is $(-2^{n-1}, 2^{n-1})$;

an n-bit overflow rate of a signal segment is set to be equal to a value of dividing a quantity of signal points with processed values exceeding the specified overflow threshold range in the signal segment by a total quantity of signal points in the signal segment;

when the signal segment is in a stationary phase and the n-bit overflow rate of the signal segment is less than a first threshold, mapping encoding based on the subtraction operation is selected to encode the processed value;

when the signal segment is in a fluctuating phase and an average information entropy of the signal segment is less than a specified entropy threshold, mapping encoding based on the logarithmic operation is selected to encode the processed value; and when the signal segment is in the fluctuating phase and the average information entropy of the signal segment is not less than the specified entropy threshold, or when the signal segment is in the stationary phase and the n-bit overflow rate of the signal segment is greater than the first threshold, mapping encoding based on the quotient-remainder operation is selected to encode the processed value.

10. The signal processing method according to claim 1, wherein:

the selecting the different reprocessing method based on the detection result of the processed value further comprises: performing secondary encoding on a signal point obtained after the mapping encoding or a signal point with a processed value that does not exceed the specified overflow threshold range, wherein the secondary encoding comprises at least one of Huffman encoding, a variant of the Huffman encoding, arithmetic encoding, a variant of the arithmetic encoding, range encoding, a variant of the range encoding, or asymmetric digital systematic encoding.

11. A signal processing model, comprising:

a processing module configured to execute the signal processing method according to claim 6; and a storage module configured to store a processed signal.

\* \* \* \* \*